US007800284B2

(12) United States Patent
Theuerkauf

(10) Patent No.: US 7,800,284 B2
(45) Date of Patent: Sep. 21, 2010

(54) ELECTROACOUSTIC TRANSDUCER WITH ANNULAR ELECTRODES

(75) Inventor: Nils Theuerkauf, Oldenburg (DE)

(73) Assignee: ATLAS ELEKTRONIK GmbH, Bremen (DE)

( * ) Notice: Subject to any disclaimer, the term of this patent is extended or adjusted under 35 U.S.C. 154(b) by 204 days.

(21) Appl. No.: 12/226,010

(22) PCT Filed: Mar. 9, 2007

(86) PCT No.: PCT/EP2007/002071

§ 371 (c)(1),
(2), (4) Date: Oct. 3, 2008

(87) PCT Pub. No.: WO2007/115625

PCT Pub. Date: Oct. 18, 2007

(65) Prior Publication Data

US 2009/0174288 A1 Jul. 9, 2009

(30) Foreign Application Priority Data

Apr. 3, 2006 (DE) ....................... 10 2006 015 493

(51) Int. Cl.
*H01L 41/04* (2006.01)
*H04R 17/00* (2006.01)

(52) U.S. Cl. ....................... 310/337; 367/141; 367/155; 310/365

(58) Field of Classification Search ................. 310/337, 310/365; 367/155
See application file for complete search history.

(56) References Cited

U.S. PATENT DOCUMENTS 2,967,956 A * 1/1961 Dranetz et al. .............. 310/330
3,384,767 A * 5/1968 Arnold et al. ............... 310/366
4,518,889 A * 5/1985 'T Hoen ...................... 310/357
4,586,512 A * 5/1986 Do-huu et al. .............. 600/447
4,801,835 A * 1/1989 Nakaya et al. .............. 310/358
5,081,995 A * 1/1992 Lu et al. ..................... 600/459
5,250,869 A 10/1993 Ishikawa et al.
5,465,725 A * 11/1995 Seyed-Bolorforosh ...... 600/459
5,563,354 A * 10/1996 Kropp ................... 73/862.473
5,794,023 A * 8/1998 Hobbs et al. ................ 359/565
6,211,605 B1 * 4/2001 Burov et al. ................ 310/328
6,682,214 B1 * 1/2004 Vivek et al. ................ 366/108
6,960,864 B2 * 11/2005 Urano et al. ................ 310/307
6,984,923 B1 * 1/2006 Walsh et al. ................ 310/334

FOREIGN PATENT DOCUMENTS

DE 100 52 636 5/2002

OTHER PUBLICATIONS

Biller et al., "Optimization of Radiation Patterns for an Array of Concentric Ring Sources," *IEEE Transactions on Audio and Electroacoustics*, vol. AU-21, No. 1, Feb. 1973.

* cited by examiner

*Primary Examiner*—J. SanMartin
(74) *Attorney, Agent, or Firm*—Fitch, Even, Tabin & Flannery; Norman N. Kunitz

(57) ABSTRACT

An electroacoustic transducer, particularly for underwater use, having a ceramic body (10) and a pair of electrodes, whose flat electrodes (11, 12) are arranged on mutually averted end faces (101, 102) of the ceramic body (10). At least one electrode (11) is structured in order to effectively suppress the side-lobes in the directional characteristic for all spatial directions such that the density of the ceramic body (10) decreases from the body center to the body edge.

8 Claims, 3 Drawing Sheets

ELECTROACOUSTIC TRANSDUCER WITH ANNULAR ELECTRODES

CROSS-REFERENCE TO RELATED APPLICATIONS

Figure 1:
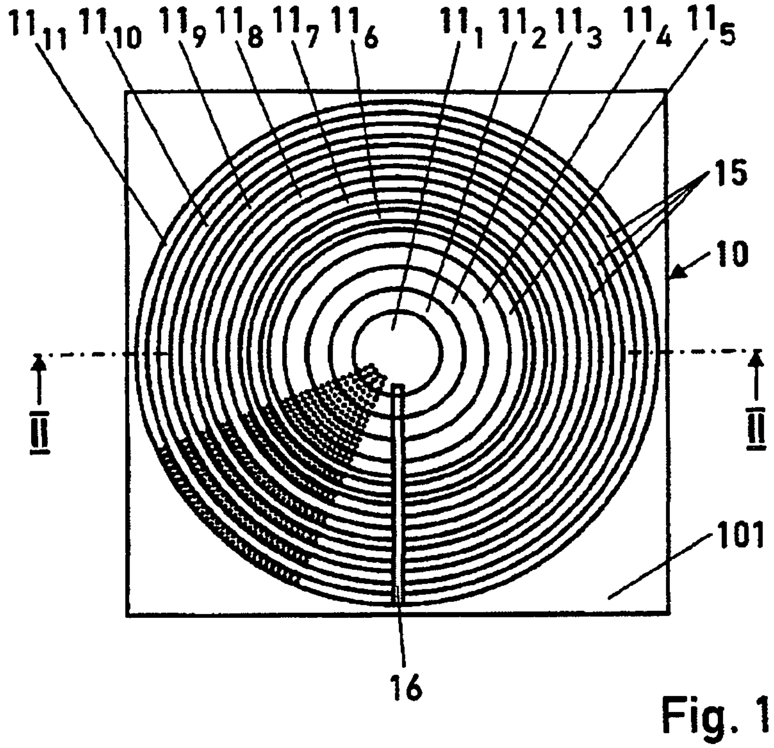

This is a U.S. National Phase of International Application PCT/EP2007/002071, filed Mar. 9, 2007 and claims the benefit of foreign priority under 35 U.S.C. §119 of German Patent Application 10 2006 015 493.2, filed Apr. 3, 2006, the entire disclosures of which are hereby incorporated by reference herein.

BACKGROUND OF THE INVENTION

The invention relates to an electroacoustic transducer, in particular for underwater use, as claimed in the precharacterizing clause of claim 1.

A known electroacoustic or ultrasound transducer (DE 100 52 636 A1) has a composite body with a multiplicity of ceramic elements which extend between the upper face and lower face of the body, are composed of piezoelectric or electrostrictive ceramic, and are embedded in a plastic, for example a polymer. The upper face and lower face of the composite body are each fitted with an electrode, which makes contact with the end surfaces of the ceramic elements. The ceramic elements are in the form of columns and are arranged like a matrix in rows and columns. The bandwidth of the transducer can be increased by provision of slight disorganization. A transducer such as this has a directivity characteristic with relatively high, undesirable side lobes.

When a plurality of such transducers are joined together to form a flat base, a so-called array, the side lobes in the directivity characteristic of the base can be reduced by so-called amplitude shading to a desired extent of the signals which are supplied to the individual transducers or are tapped off from the individual transducers. One known option for joining the transducers together to form a base (DE 100 52 636 A1) is to form the composite bodies of all the transducers in a base integrally, and to fit the common composite body with individual electrodes which are in the form of mutually separated strips. In this case, a strip pair which is arranged coincident on the upper face and lower face of the common transducer body in each case covers a group of ceramic elements within the common composite body.

The invention is based on the object of reducing the side lobes in the transducer directivity characteristic of a transducer of the type mentioned initially.

The electroacoustic transducer according to the invention has the advantage that side lobes are effectively suppressed by the structuring of the at least one electrode. In comparison to a conventional transducer design, only minor additional costs are required for the electrode structuring, although these are not considered significant when traded off against the considerable gain in side-lobe suppression of about 6-8 dB.

Because of its low manufacturing costs, the transducer according- to the invention can be used wherever physically small and low-cost transducers are required. One preferred field of application is therefore for all underwater vehicles that are conceived as non-reusable disposable vehicles, for example in order to provide a short-range sonar for a mine destruction drone.

Further advantageous fields of use for the transducer according to the invention are Doppler logs for measurement of the vessel speed, low-volume sonar antennas, for example for side scanning sonars on unmanned underwater drones for reconnaissance, as well as bottom profile surveying and ultrasound measurement sensors.

Expedient embodiments of the electroacoustic transducer according to the invention, together with advantageous developments and refinements of the invention, are specified in the further claims.

According to one advantageous embodiment of the invention, the electrode is structured in such a manner that it is subdivided by a plurality of circumferential gaps, preferably annular gaps, into concentric electrode sections. In this case, the subdivision is carried out such that the electrode sections which run concentrically around the central electrode section have a radial gap width which decreases as the distance of the individual electrode sections from the central electrode section increases. All the electrode sections are electrically conductively connected to one another.

Figure 2:
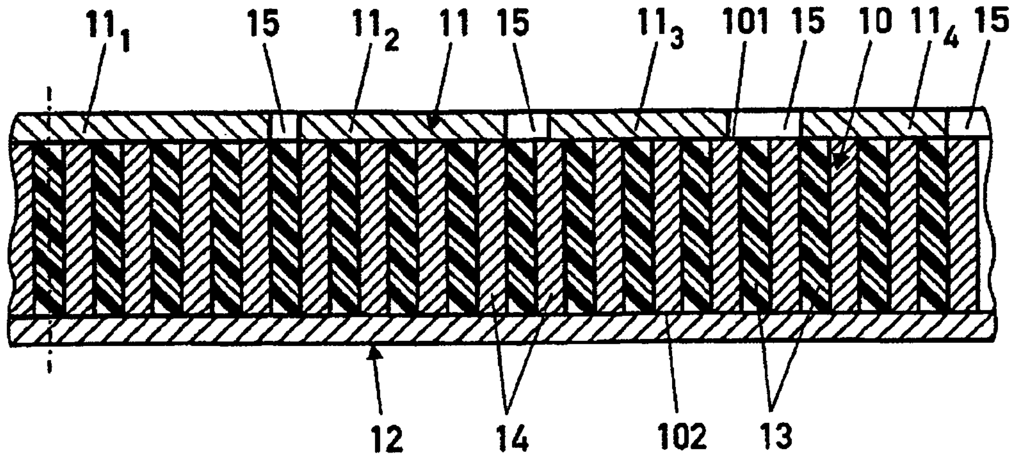
Figure 3:
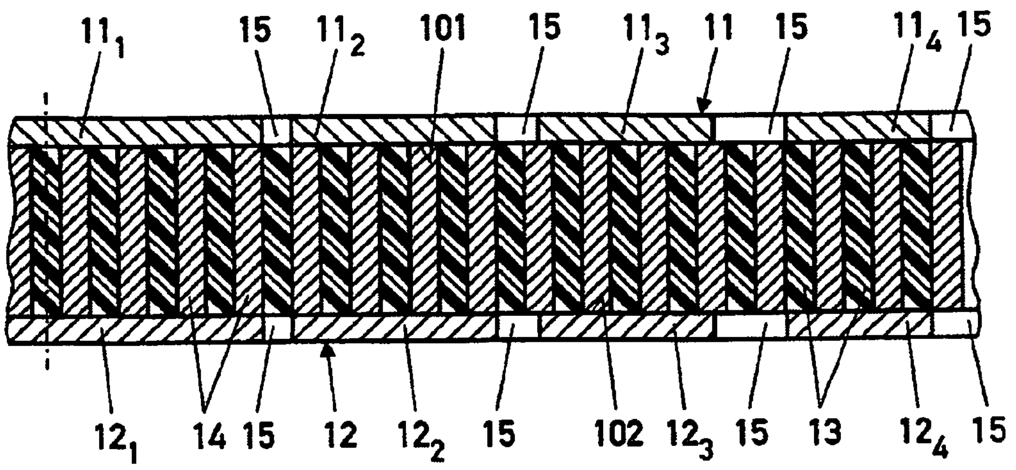
Figure 4:
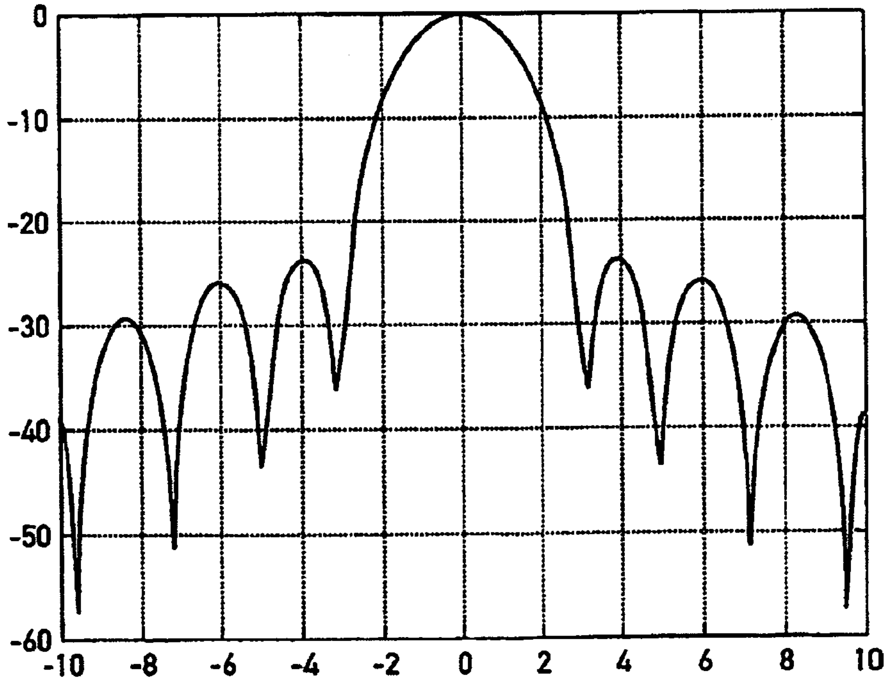
Figure 5:
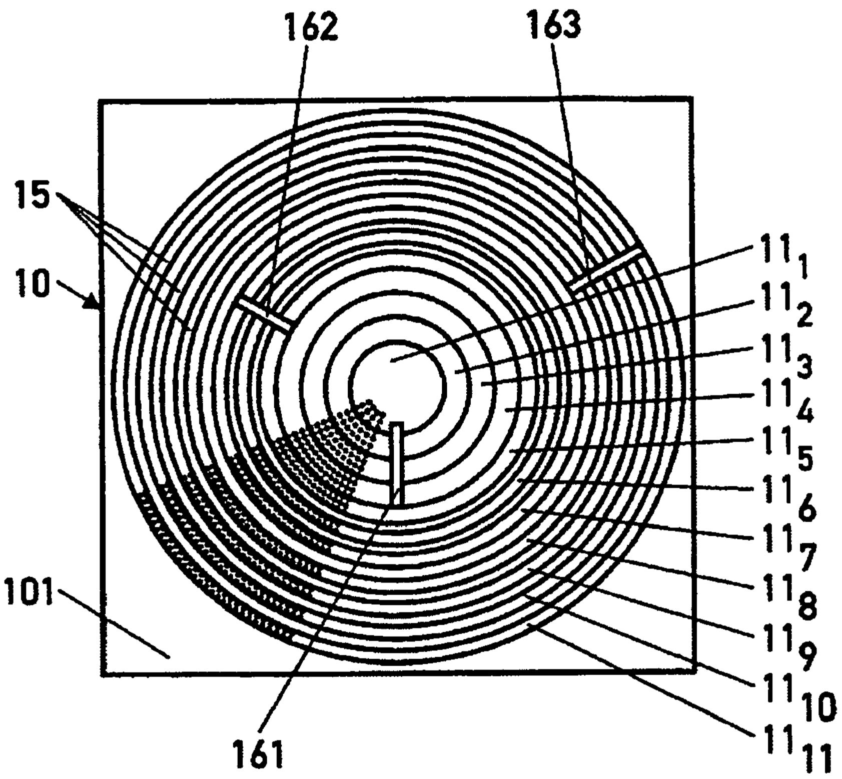
Figure 6:
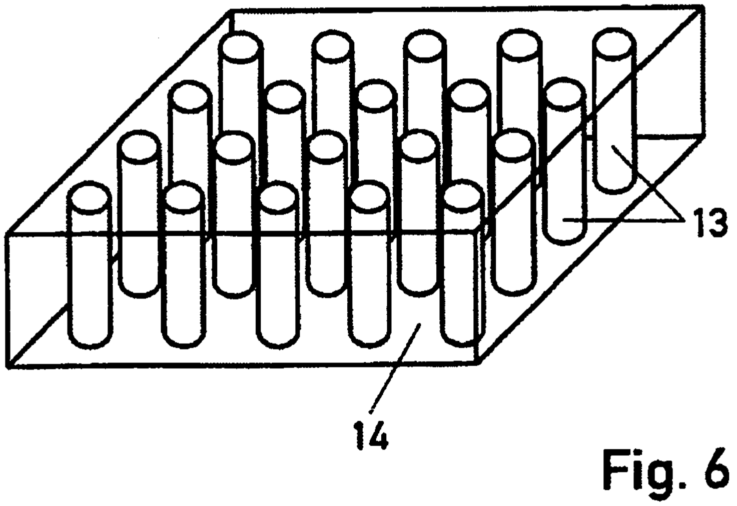

Such structuring can be produced with minimal additional effort, for example simply by etching the circumferential gaps out of the electrode surface. In this case, a circular electrode with annular gaps not only has a manufacturing advantage but also an acoustic advantage since the side-lobe suppression achieved by the structure is symmetrical in all directions, so that the transducer has the same reception and/or transmission characteristic in all spatial directions. The invention will be described in more detail in the following text with reference to exemplary embodiments that are illustrated in the drawing, in which:

FIG. 1 shows a plan view of an electroacoustic transducer,

FIG. 2 shows a detail in the form of a section through the electroacoustic transducer along the line II-II in FIG. 1, illustrated greatly enlarged, FIG. 3 shows the same illustration as in FIG. 2 of a second exemplary embodiment of the electroacoustic transducer, FIG. 4 shows a longitudinal section through a directivity characteristic of the electroacoustic transducer in FIG. 1, FIG. 5 shows the same illustration as in FIG. 1, with a modification, and FIG. 6 shows a schematic, perspective illustration of a composite ceramic.

The electroacoustic transducer illustrated in the form of a plan view in FIG. 1 and in the form of a detail of the longitudinal section in FIG. 2 has a ceramic body 10 which is composed of a so-called composite ceramic, and an electrode pair whose flat electrodes 11, 12 are arranged on mutually averted end faces 101, 102 of the ceramic body 10. The ceramic, which is sketched as a so-called 1-3 composite schematically in the form of a perspective view in FIG. 6, has, in a known manner, a multiplicity of small ceramic rods 13 composed of piezoelectric or electrostrictive ceramic, which are embedded in a polymer 14. The small ceramic rods 13 extend between the two end faces 101 and 102 of the ceramic body 10 (FIG. 2) and are arranged separated from one another, like a matrix, in rows and columns (FIG. 6). The free end surfaces of the small ceramic rods 13 in the end faces 101 and 102 of the ceramic body 10 make contact with the electrodes 11, 12, as can be seen in FIG. 2. Instead of the small ceramic rods, a modified 1-3 composite ceramic has very much thinner ceramic threads.

The two flat electrodes 11, 12 of the electrode pair are each formed by a circular disk. The two disks have the same external diameter and are arranged on the mutually averted end faces 101 and 102 of the ceramic body 10 such that they are coincident. While the electrode 12 on the end face 102 of the ceramic body 10 is a solid circular disk, the electrode 11 on the end face 101 of the ceramic body 10 is structured. The structuring is carried out in such a manner that the physical density of the ceramic body 10 decreases radially from the inside outwards. The physical density means the ratio of the acoustically active body surface area to the acoustically inactive body surface area within a normal circuit with a defined small radius, with the acoustically active body surface area being that area in which the ceramic material makes contact with the electrode material. In order to assess the physical density, the normal circuit is shifted on the body surface from the body center to the body edge, and the ratio is in each case formed.

FIG. 1 illustrates one possible way to structure the electrode 11. In this case, the electrode 11 has a plurality of concentric annular gaps 15 which can be produced, for example, by etching of the electrode 11. In order to produce the physical density decreasing outwards, the concentric annular gaps 15 have a radial width which increases as the radial distance of the annular gaps 15 from the disk center increases. These annular gaps 15 subdivide the electrode 11 into separate electrode sections $\mathbf{11}_1$ to $\mathbf{11}_{11}$, although they are electrically connected to one another and are thus at the same electrical potential. The electrical connection is made by means of a radial web 16 composed of electrically conductive material, which extends over all the electrode sections $\mathbf{11}_1$ to $\mathbf{11}_{11}$, starting from the center, circular electrode section $\mathbf{11}_1$, to the outer, annular electrode section $\mathbf{11}_{11}$ which is furthest away from the circular electrode section $\mathbf{11}_1$, making contact with each electrode section $\mathbf{11}_1$ to $\mathbf{11}_{11}$. The radial distance between the center lines of the concentric annular gaps 15 is constant, as is the radial distance between the center lines of the annular electrode sections $\mathbf{11}_2$ to $\mathbf{11}_{11}$. Because the width of the annular gaps 15 increases towards the outside, the radial width of the annular electrode section $\mathbf{11}_2$ to $\mathbf{11}_{11}$ decreases from the inner annular electrode section $\mathbf{11}_2$, which concentrically surrounds the center, circular electrode section $\mathbf{11}_1$, to the outer, annular electrode section $\mathbf{11}_{11}$. The physical density also decreases as the radial width decreases.

Alternatively, the annular gap width can also be kept constant, with the radial distance between the annular gaps being reduced to an increasing extent towards the outside. This also leads to the desired decrease in the radial width of the annular electrode sections $\mathbf{11}_2$ to $\mathbf{11}_{11}$ from the inside outwards.

FIG. 4 shows the directivity characteristic of the electroacoustic transducer, in the form of a section. The section plane of the directivity characteristic runs at right angles to the plane of the drawing through the section line II-II. As can be seen from FIG. 4, the structuring of the electrode 11 forces the side lobes in the directivity characteristic below −24 dB.

While, in the case of the described exemplary embodiment of the electroacoustic transducer shown in FIGS. 1 and 2, only the electrode 11 is structured in the described manner, the other electrode 12 of the electrode pair in the exemplary embodiment of the electroacoustic transducer sketched as a detail in the form of a section in FIG. 3 is also structured in the same way. This ensures a high degree of decoupling between the active and inactive areas in the ceramic body 10.

The electroacoustic transducer which is illustrated in the form of a plan view in FIG. 5 differs from the electroacoustic transducer illustrated in FIG. 1 only in that the radial web 16 for electrical connection of the electrode sections $\mathbf{11}_1$ to $\mathbf{11}_{11}$ is subdivided into a plurality of web sections, in this case into three web sections 161, 162 and 163. The web sections 161 to 163 are arranged shifted with respect to one another through the same circumferential angle, with the first web section 161 electrically connecting the electrode sections $\mathbf{11}_1$ to $\mathbf{11}_4$ to one another, the second web section 162 electrically connecting the electrode sections $\mathbf{11}_5$ to $\mathbf{11}_7$ to one another, and the third web sections 163 electrically connecting the electrode sections $\mathbf{11}_8$ to $\mathbf{11}_{11}$, to one another. All the web sections 161 to 163 are at the same electrical potential. In the exemplary embodiment in FIG. 5, the circumferential angle through which the web sections 161 to 163 are shifted with respect to one another is 120°. However, like the number of web sections, this shift may be chosen as required. The offset web sections make it possible to largely avoid any disturbances caused by the just one web in the directivity characteristic. Instead of the web 16 (FIG. 1) or the web sections 161 to 163 (FIG. 5), the electrode sections $\mathbf{11}_1$ to $\mathbf{11}_{11}$ may also be connected to one another by wiring.

The invention claimed is:

1. An electroacoustic transducer, for underwater use, having a body (10) composed of piezoelectric or electrostrictive ceramic, and having an electrode pair, comprising two flat electrodes (11, 12) which are arranged on mutually averted end faces (101, 102) of the ceramic body (10) and at least one of which is structured such that the coating density of the ceramic body (10) decreases from the body center to the body edge, wherein the structuring is carried out such that the electrode (11) is subdivided by a plurality of circumferential gaps (15) into concentric electrode sections ($\mathbf{11}_1$ to $\mathbf{11}_{11}$) with a width which decreases as the distance of the electrode sections ($\mathbf{11}_1$ to $\mathbf{11}_{11}$) from the central electrode section ($\mathbf{11}_1$) increases, the distances between the center lines of the gaps (15) are constant, and the gaps (15) have a width which increases towards the electrode edge, and the electrode sections ($\mathbf{11}_1$ to $\mathbf{11}_{11}$) which are separated by the gaps are electrically connected to one another.

2. The transducer as claimed in claim 1, wherein the electrical connection between the electrode sections ($\mathbf{11}_1$ to $\mathbf{11}_{11}$) is made by a preferably radially running web (16) which is composed of electrically conductive material and makes contact with all the electrode sections ($\mathbf{11}_1$ to $\mathbf{11}_{11}$).

3. The transducer as claimed in claim 2, wherein the web (16) is subdivided into a plurality of web sections (161, 162, 163), and the web sections (161, 162, 163) are arranged shifted through any desired circumferential angle with respect to one another.

4. The transducer as claimed in claim 1, wherein the other electrode (12) of the electrode pair has the same dimensions and, on the other end face (102) of the ceramic body (10), is arranged to be coincident with the first electrode (11).

5. The transducer as claimed in claim 1, wherein the two electrodes (11, 12) in the electrode pair are identical, and are arranged to be coincident with one another on the two end faces (101, 102) of the ceramic body (10).

6. The transducer as claimed in claim 1, wherein the electrodes (11, 12) are circular, and the circumferential gaps represent annular gaps (15).

7. The transducer as claimed in claim 1, wherein the ceramic body (10) is composed of a composite ceramic.

8. The transducer as claimed in claim 7, wherein the composite ceramic is a 1-3 composite which has a multiplicity of small ceramic rods (13) or ceramic threads which are aligned parallel to one another and are embedded at a distance from one another in a polymer, and their end surfaces can be made contact with by means of the electrodes (11, 12), on the mutually averted end faces of the ceramic body (10).

* * * * *